United States Patent
Ku et al.

(10) Patent No.: US 6,338,926 B1
(45) Date of Patent: Jan. 15, 2002

(54) FOCUS MEASUREMENT METHOD

(75) Inventors: Chin-Yu Ku, Hsinchu; Yung-Chung Cheng, Hsinchu Hsien, both of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/662,051

(22) Filed: Sep. 15, 2000

(51) Int. Cl.[7] .................................................. G03F 9/00
(52) U.S. Cl. ........................................................ 430/30
(58) Field of Search .......................................... 430/30

Primary Examiner—Christopher G. Young
(74) Attorney, Agent, or Firm—Intellectual Property Solutions, PLLC

(57) ABSTRACT

A focus measurement method uses a specially designed pattern to measure the best focus of the exposure process. The specially designed pattern is a binary mask layout of the bar-in-bar pattern, which comprises two rectangles having the same center of gravity. When the bar-in-bar pattern is transferred to a photoresist, the centers of gravity of the two rectangles will shift based on focus setting. Then, by fitting the function of the shift for the focus setting to a second order polynomial equation to obtain a fitting curve and taking the derivative of the fitting curve, the best focus can be obtained, wherein the best focus is located at the point where the derivative is zero.

6 Claims, 4 Drawing Sheets

FOCUS MEASUREMENT METHOD

BACKGROUND OF THE INVENTION

1. Field of the Invention

The present invention relates to a focus measurement method. More particularly, the present invention relates to a method of finding the best focus of an exposure process by using a specially designed pattern mask.

2. Description of the Prior Art

Photolithography is a process of transferring the patterns on a mask into a photoresist over a wafer. In order to completely and exactly transfer patterns into the photoresist, the patterns projected onto the photoresist by the exposure machine should have a certain depth of focus (DOF) such that the whole photoresist, both near the surface side of the photoresist and near the wafer side, has the same focus. With the decreasing depth of focus of modern high NA lithographic tools, accurate and reliable determination of the best focus, tilting, and field curvature has become increasingly important.

Conventionally, focus exposure matrix (FEM) is exposed with dot reticle, then the best focus is found using the naked eye. The foregoing method is fast, but it is easy to make a wrong decision. This results in low accuracy (error range is ±0.1 μm) This method is presently used to correct the exposure machine daily.

Another method of measuring the best focus is using a focus exposure matrix with line patterns to carry out the photolithography process, then measuring linewidth by SEM. However, due to improvements in photoresist material, the photoresist maintains almost the same linewidth over a wide range of defocus. Therefore, it is almost impossible to determine the best focus by SEM measurement of photoresist linewidth.

SUMMARY OF THE INVENTION

Therefore, the present invention provides a simple method to easily find the best focus with high accuracy.

Furthermore, the present invention provides a method to detect tilting or field curvature for each product.

Moreover, the present invention provides a mask, which can be used to monitor focus, tilting and field curvature everyday.

The present invention provides a focus measurement method, comprising: providing a mask having a pattern composed of a first rectangle and a second rectangle located inside the first rectangle, the first rectangle and the second rectangle having the same center of gravity, each of the first and second rectangles having four bars, each bar having several columns of different pattern width but the same length, wherein adjoining patterns in the same column are separated by a first distance, and adjoining patterns belonging to different columns are separated by a second distance, wherein, for corresponding bars of the first and second rectangles, the widths of the patterns belonging to different columns decrease in a first direction in the first rectangle, the widths of the patterns belonging to different columns increase in the first direction in the second rectangle; performing an over-exposure process with a variety of focus settings in a photoresist layer on a wafer by using the mask; measuring an overlay shift of the center of gravity of the first and second rectangles in the photoresist under the different focus settings; and fitting the function of the overlay shift to the focus setting by a second order polynomial equation and getting a fitting curve, then taking the derivative of the fitting curve so as to obtain the best focus, which is located at the point where the derivative is zero.

According to one embodiment of the present invention, each bar at least comprises two columns with two different pattern widths. Preferably, however, each bar comprises four columns with four different pattern widths. Exposure energy used in the over-exposure process should be sufficient to exceed the resolution of the holes. Preferably, exposure energy used in the over-exposure process is four times the threshold energy. Furthermore, seven points of the overlay shift can be used to obtain the fitting curve.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

The present invention provides a specially designed pattern of a mask to measure the best focus. The concept of the specially designed pattern is based on the deterioration of a latent image under defocus. The deformations of the latent image profile for large and small patterns are different. Therefore, the center of gravity of the patterns will shift. Using the above-mentioned character, the best focus can be obtained indirectly.

The specially designed mask pattern provided by the present invention is a bar-in-bar (BIB) pattern with a binary mask. When the bar-in-bar pattern is transferred to the photoresist by photolithography process, the overlay shift of the transferred pattern in the photoresist can be measured with an overlay measurement system, which is a very fast measurement. The overlay shift under various focus setting can be depicted by a second order polynomial equation. Then, by simply differentiating the fitting equation, the best focus can be determined.

Figure 1:
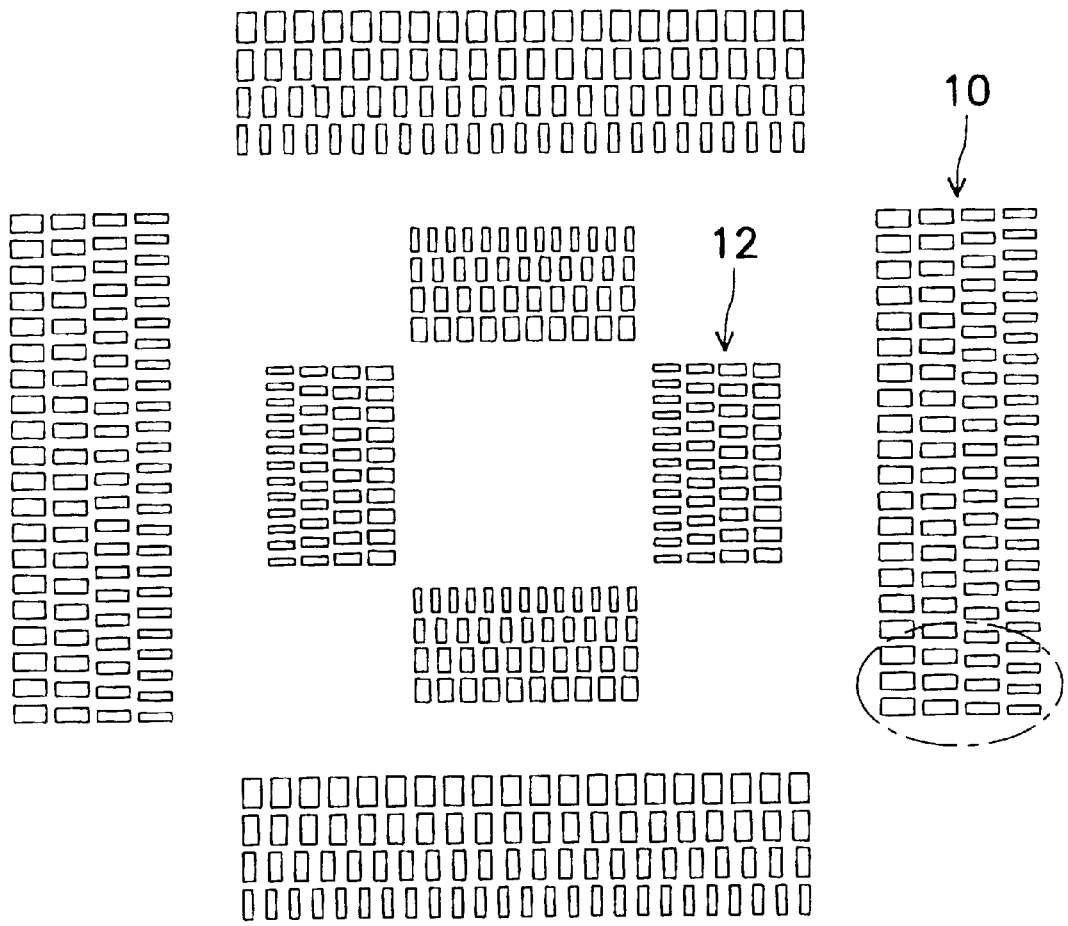
FIG. 1 illustrates a pattern in a mask according to the embodiment of the present invention.
Figure 2:
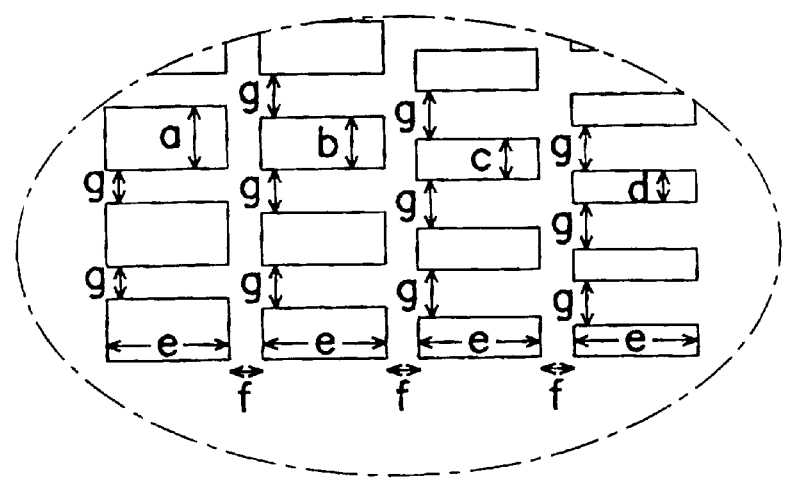
FIG. 2 is a partial enlargement of FIG. 1.

As shown in FIG. 1, the bar-in-bar pattern is composed of two rectangles 10 and 12, which have the same centers of gravity. Each of rectangles 10 and 12 has four bars; each bar has several columns of different pattern width. FIG. 2 is a partial enlargement of FIG. 1. In the embodiment, the lengths of all the patterns are the same, and are marked as "e". Furthermore, the distances between adjoining patterns in the same column are all the same, and are marked "g", while the distances between adjoin patterns belonging to different columns are also the same, and are marked "f". For each corresponding outer and inner bar of rectangles 10 and 12, the widths of the patterns belonging to different columns decrease in a first direction in rectangle 10, and that of the patterns belonging to different columns increase in the first direction in rectangle 12. That is, adjacent inner and outer bars are mirrors of each other.

In this embodiment, as show in FIG. 1 and FIG. 2, each bar has a four column pattern with four various widths, a>b>c>d, which are employed to enhance the overlay shifting and maintain the stability of the measured result. However, the number of columns in each bar is not limited in four. Each bar is composed of at least two columns of at least two different pattern widths.

Figure 3:
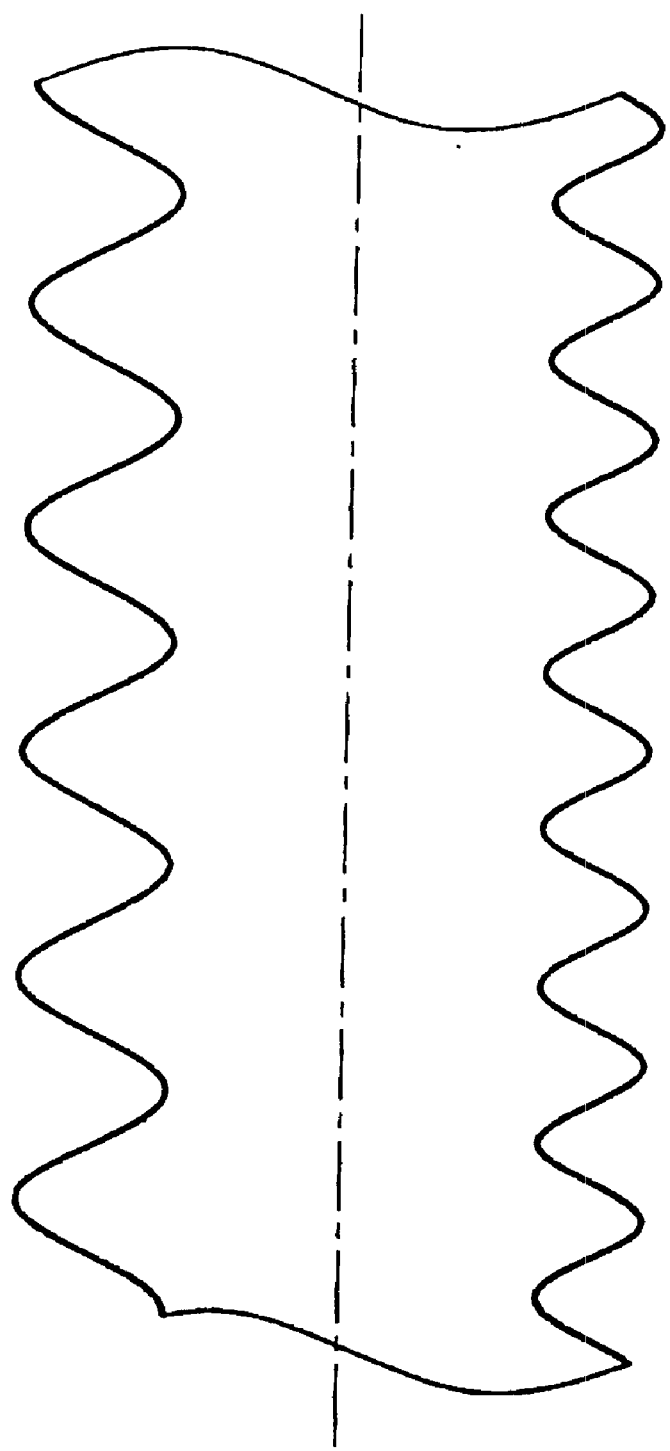
FIG. 3 illustrates partial patterns of the photoresist after the pattern of the mask is transferred to the photoresist, wherein the straight line indicates the centerline of the bar.

It is noted that the exposure energy is selected to be sufficient to overexpose the photoresist when transferring the bar-in-bar pattern in the mask to the photoresist. The exposure energy is large enough to exceed the resolution of holes. For example, the exposure energy is selected to be about four times the threshold energy (or "energy to clear", which is the minimum required energy to remove photoresist) $E_{th}$ to over-expose the photoresist, in order to stabilize the profile of the exposed photoresist patterns and get more accuracy. FIG. 3 shows partial patterns of the photoresist after the bar-in-bar pattern of the mask is transferred to the photoresist, wherein the straight line indicates the centerline of the patterns of the photoresist.

Figure 4A:
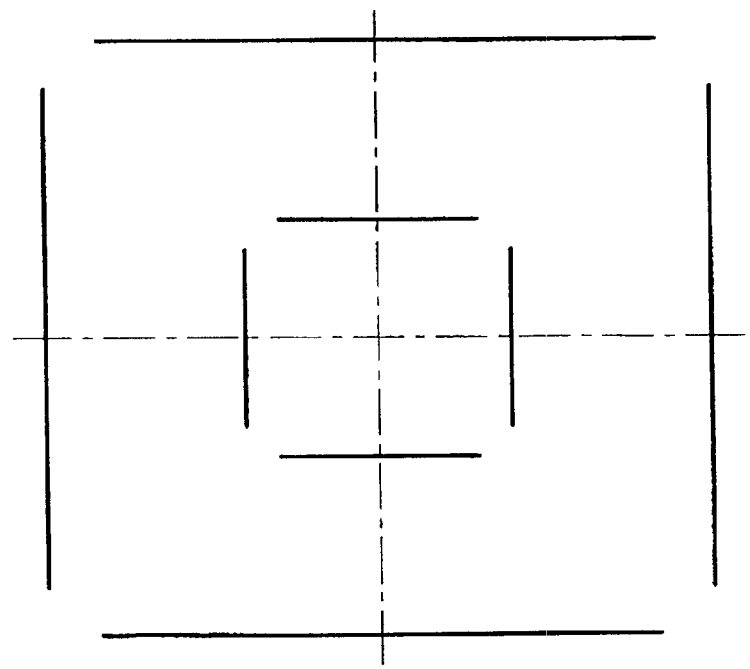
FIG. 4A illustrates the centers of gravity of the two rectangles overlapping at the best focus, wherein the overlay shift is (0,0)
Figure 4B:
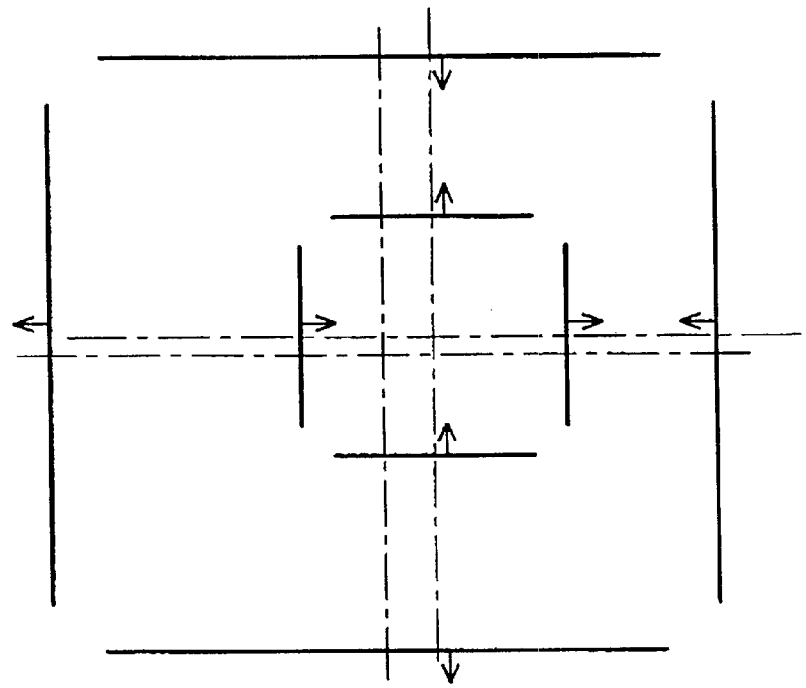
FIG. 4B illustrates the centers of gravity of the two rectangles shift under defocus, wherein the overlay shift is (x,y)

Because the deformations of the latent image profile for large and small patterns are different, the center of the bar, composed of different pattern size, will shift toward to the larger pattern side under defocus. Therefore, the center of gravity of the rectangle 10 or 12 will shift. FIGS. 4A and 4B show two situations. FIG. 4A illustrates the centers of gravity of the two rectangles 10 and 12 overlapping at the best focus, wherein the overlay shift is (0,0); FIG. 4B illustrates the centers of gravity of the two rectangles 10 and 12 shift under defocus, wherein the overlay shift is (x,y).

Figure 5:
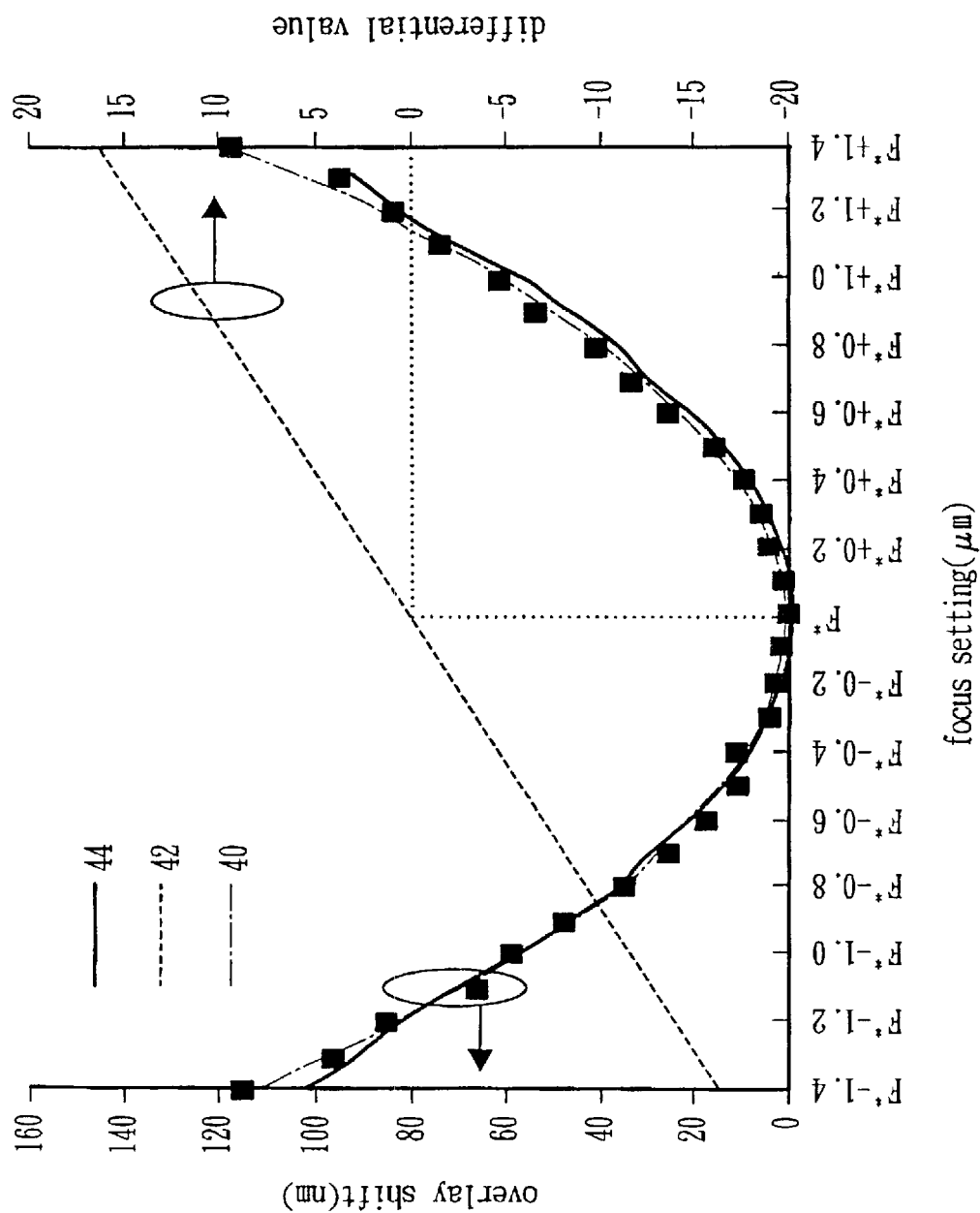
FIG. 5 shows the curves of the overlay shift (y-axis) for various focus setting (x-axis).

By changing focus setting, and getting the overlay shift (x,y) of two rectangles 10 and 12 in x-direction and y-direction based on each focus setting, drawing a curve of the overlap shift (y-axis) for various focus settings (x-axis) can be obtained, as shown in FIG. 5. The symmetrical shifting result can be well fitted by a second order polynomial equation with almost negligible fitting error. The fitting curve is marked as 40. The fitting curve 40 from experimental results almost matches the simulated curve 44 from simulated results. By taking the derivative of the fitting curve 40, the best focus can be obtained, and which is located at the point where the derivative is zero.

The accuracy of getting the best focus according to the present invention is very high, and its maximum error is less than 0.05 μm. Furthermore, at least seven sampling points can obtain the best focus with accuracy and speed.

The bar-in-bar pattern can be set in a scribe line, if necessary, for detecting tilting and field curvature of the products, which can used to correct the product or the layer based on the detecting results. Moreover, the mask can monitor focus of the exposure machine daily.

According to the above-mentioned description, the present invention at least has following advantage:

1. The fabricating of the mask with a bar-in-bar pattern is simple, and the bar-in-bar pattern can be easily made by a binary mask.

2. Using the mask with a bar-in-bar pattern and changing the focus setting can easily get the best focus. The curve of the overlay shift for various focus setting can be obtained using, for example, a seven point sampling plan. The method is simple, and the result is accurate.

3. The present invention provides a specially designed bar-in-bar pattern to measure the best focus, which saves time. Therefore, this method can monitor focus, tilting and field curvature daily.

4. The bar-in-bar pattern can be set in a scribe line for detecting tilting and field curvature of the exposure field.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A focus measurement method, comprising:

providing a mask having a pattern, the pattern composed of a first rectangle and a second rectangle located inside the first rectangle, the first rectangle and the second rectangle having the same center of gravity, each of the first and second rectangles having four bars, each bar having several columns of different pattern width but the same length, wherein adjoining patterns in the same column are separated by a first distance, and adjoining patterns belonging to different columns are separated by second distance, and wherein, for corresponding bars of first and second rectangles, the widths of the patterns belonging to different columns decrease in a first direction in the first rectangle, the widths of the patterns belonging to different columns increase in the first direction in the second rectangle;

performing an over-exposure process with different focus settings in a photoresist layer on a wafer by using the mask;

measuring an overlay shift of the center of gravity of the first and second rectangles in the photoresist under different focus settings; and fitting the function of the overlay shift to the focus setting by a second order polynomial equation and getting a fitting curve, then taking the derivative of the fitting curve so as to obtain the best focus, which is located at the point where the derivative is zero.

2. The focus measurement method as claimed in claim 1, wherein each bar at least comprises two columns with two different pattern widths.

3. The focus measurement method as claimed in claim 1, wherein each bar comprises four columns with four different pattern widths.

4. The focus measurement method as claimed in claim 1, wherein an exposure energy used in the over-exposure process is sufficient to exceed the resolution of holes.

5. The focus measurement method as claimed in claim 1, wherein an exposure energy used in the over-exposure process is four times the threshold energy.

6. The focus measurement method as claimed in claim 1, wherein at least seven points of the overlay shift are used to obtain the fitting curve.

* * * * *